United States Patent [19]

D'Asaro

[11] 4,244,775
[45] Jan. 13, 1981

[54] PROCESS FOR THE CHEMICAL ETCH POLISHING OF SEMICONDUCTORS

[75] Inventor: Lucian A. D'Asaro, Madison, N.J.

[73] Assignee: Bell Telephone Laboratories, Incorporated, Murray Hill, N.J.

[21] Appl. No.: 34,491

[22] Filed: Apr. 30, 1979

[51] Int. Cl.³ .......................................... H01L 21/306
[52] U.S. Cl. .................................... 156/636; 156/345; 156/662
[58] Field of Search ............... 156/636, 638, 639, 345, 156/662; 51/209 DL, 281 SF, 283

[56] References Cited

U.S. PATENT DOCUMENTS

| | | | |
|---|---|---|---|
| 2,719,390 | 10/1955 | Jones | 51/209 DL |
| 3,342,652 | 9/1967 | Reisman et al. | 156/636 |
| 3,549,439 | 12/1970 | Kaueggia et al. | 156/636 |
| 3,888,053 | 6/1975 | White et al. | 51/281 SF |

OTHER PUBLICATIONS

Ryll, "Lapping Plate . . . Grooves" *Western Electric Technical Digest* No. 50 (4/78) pp. 25–26.
*Handbook of Chemistry and Physics*, 48th Ed. R. Weast editor, The Chemical Rubber Co. Cleveland Ohio p. F–17.
*Kirk–Othmer Encyclopedia of Chemical Technology*, 2nd Edition, vol. 4, p. 200.

*Primary Examiner*—Jerome W. Massie
*Attorney, Agent, or Firm*—Bruce S. Schneider

[57] ABSTRACT

A method for thinning and polishing semiconductor materials such as gallium arsenide is disclosed. This method utilizes a chemical etchant in conjunction with a grooved flat polishing plate. The polishing plate has a hardness greater than 2 on the mohs scale. High quality polished surfaces are obtained. Exemplary of polishing plate materials is quartz.

6 Claims, 3 Drawing Figures

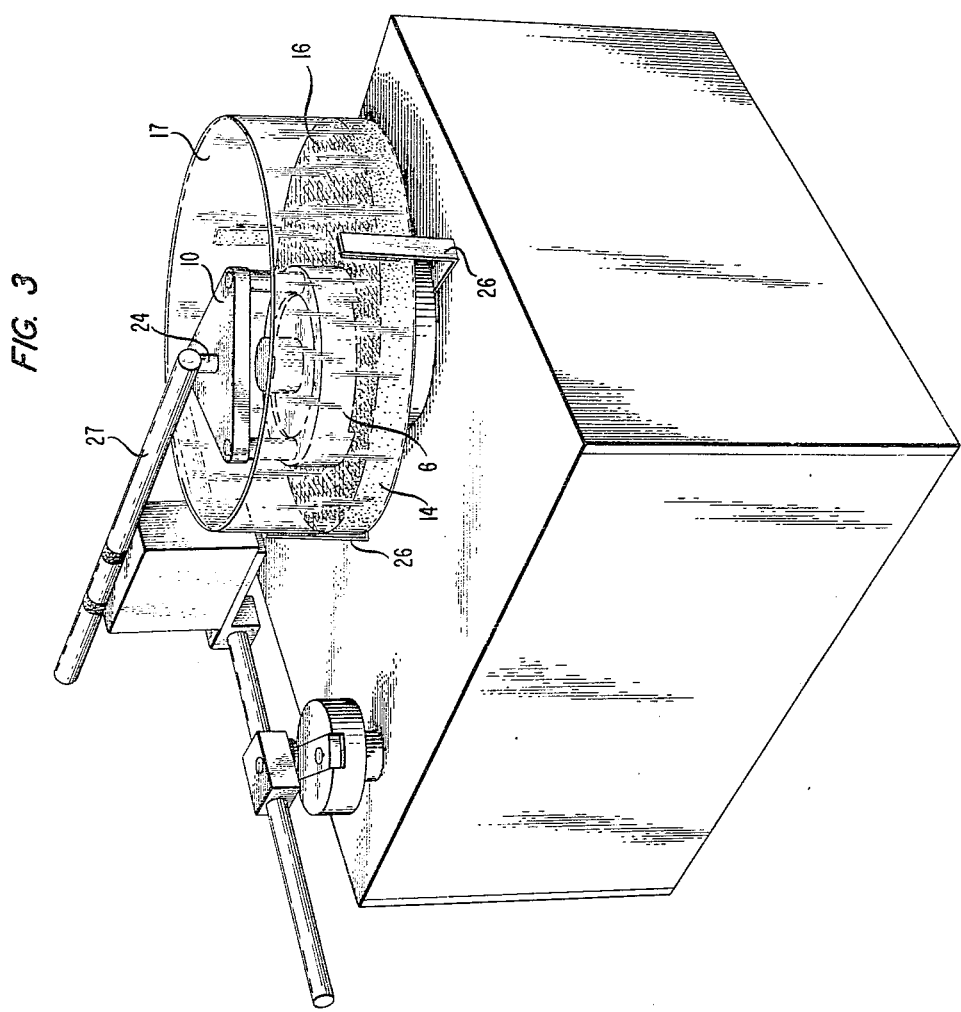

PROCESS FOR THE CHEMICAL ETCH POLISHING OF SEMICONDUCTORS

BACKGROUND OF THE INVENTION

1. Field of the Invention

This invention relates to the processing of semiconductor materials and, in particular, to the thinning or polishing of semiconductor materials.

2. Art Background

In the fabrication of semiconductor devices, it is often advantageous to form a device using processes such as metallization, epitaxial growth, and lithography on a relatively thick semiconductor substrate, i.e., a substrate with a thickness greater than 15 mils, and then later thin the substrate to its final thickness of a few mils. Additionally, during device fabrication, it is frequently necessary to polish a semiconductor surface before subsequent processing steps, e.g., epitaxial deposition, are performed. In either case, it is advantageous to leave a flat, uniform surface after processing.

Various methods have evolved for accomplishing either thinning or polishing of semiconductor materials. For example, the use of an abrasive material in conjunction with a grooved polishing plate has been utilized to thin various materials. In contrast, for polishing, chemical etchants such as bromine/methanol are used on soft polishing substrates, e.g., a chemically resistant felt or a leather type material, to produce useful, polished semiconductor surfaces.

Although these procedures are quite adequate for their intended purposes, there are shortcomings associated with each procedure. When an abrasive material is used in conjunction with a grooved plate, thinning is rapidly accomplished. However, the quality of the surface is not exemplary. Typically, surfaces obtained through abrasive treatment show scratch marks on the order of the size of the abrasive particles. Because of this limitation, abrasives usually are used where rapid material removal is desired and where a scrath-free surface quality is not essential. In contradistinction, the use of chemical etchants in conjunction with soft polishing plates produces highly polished scratch-free surfaces. (See, for example, Sullivan et al, *Journal of the Electrochemical Society*, 110, 585 [1963].) The etchant produces uniform removal while the soft polishing plate insures a scratch free surface. Surfaces showing no appreciable scratches and having flatnesses at the center of the polished surface on the order of $1\mu$ are obtainable. The use of soft polishing substrates, such as Pellon cloth, (a proprietary felt type cloth product of Geoscience Instruments Corp. New York) to preclude scratching and, thus, to obtain high polishes also, unfortunately, results in the serious rounding of the polished semiconductor material at its extremities. Although the central portion of the polished material has an excellent surface, the rounded edges are not useable. This waste is undesirable when expensive semiconductor materials such as GaAs are employed. When the wafer has been previously processed using epitaxy, metallization, and other costly techniques, this waste is even more undesirable.

SUMMARY OF THE INVENTION

A method exhibiting high removal rates while yielding excellent polishes without objectionable edge rounding has been found. The use of a chemical etchant in conjunction with a grooved polishing plate yields adequate removal rates while unexpectedly maintaining without objectional rounding the surface quality obtainable with the etchant. To accomplish this result, the polishing plate must have a mohs hardness greater than 2. (See *Danas Manual of Minerology*, 17th Ed. revised by C. S. Hurlbut, John Wiley and Sons, New York [1966] page 153 for a definition of the mohs scale and G. F. Kinney, *Engineering Properties and Applications of Plastics*, John Wiley & Sons, New York, [1957] particularly page 202 for a comparison of mohs to other units of hardness.) Surprisingly, the groove edges in this hard plate do not cause surface scratches. If a suitable chemical polish is utilized with a semiconductor substrate, removal rates as fast as 15 mils/hr are obtainable with an associated surface flatness of $\pm 0.2$ mils over an entire 1½ inch diameter wafer. Surface irregularities of $\pm 250$ A are typical.

BRIEF DESCRIPTION OF THE DRAWING

FIG. 3 is a schematic representation of an apparatus suitable for the practice of the invention.

DETAILED DESCRIPTION

The invention is generally applicable to the combination of semiconductor material with a suitable chemical etchant. However, for purposes of clear description, the inventive process will be disclosed in the terms of etching a GaAs substrate. It should be understood that the use of other semiconductor substrates with their associated chemical etchant is equally applicable to the subject process.

Figure 1:
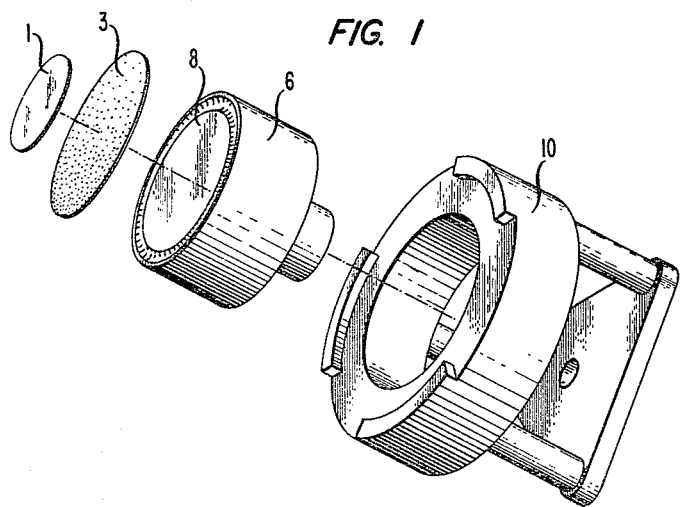
FIG. 1 is a representation of a body useful as a holder for the material to be polished by the subject process.

The semiconductor body to be treated must be mounted so that it does not distort during the treatment process. The method of mounting is not critical, however, it has been found advantageous to mount semiconductor material on the surface of a rigid body. In the preferred embodiment, the semiconductor material, 1, (FIG. 1), is mounted on a ceramic disc, 3. This mounting is accomplished in a conventional manner. In a preferred embodiment, a wax such as polypropylene wax, is coated on the rigid substrate. The GaAs, or other semiconductor material to be treated, is then pressed into the wax so that the side to be treated is exposed. (If polypropylene wax is used as the mounting material, it is advantageous to purify this wax so that polyethylene and crystalline polypropylene are removed. These impurities in the polypropylene wax degrade the adherence of GaAs to the rigid substrate.) Sufficient pressure, should be used for imbedding the semiconductor body in the wax so that only a narrow layer of wax (less than 1 mil) remains between the semiconductor body and the rigid substrate. If substantial wax, i.e., thicknesses greater than 1 mil, is left between the semiconductor body and the rigid substrate, the thickness uniformity in the final semiconductor body is degraded.

The rigid substrate, 3, (FIG. 1), is inserted in a supporting holder to provide mechanical integrity. In the preferred embodiment, the ceramic disc is appended to a teflon support 6. This is expediently done by machining a depression 8, in the support to match the thickness and shape of the mounting substrate. A thin film of a liquid, preferably the etchant, or a major constituent of the etchant, (to avoid contamination) is sufficient to hold the substrate in the support. The support is then inserted in a collar. The collar, 10, is used as a convenient method of imparting a transverse motion to the semiconductor material. However, other conventional expedients for applying this motion are acceptable. It has been found advantageous to allow the support holder to float substantially freely in the collar. That is, the mounting substrate should be held tightly so that transverse motion is limited, but should be free to move in the direction perpendicular to the plane of the surface being treated. This is accomplished by employing a collar having an opening which allows a sliding fit of the mounting substrate in the collar.

Figure 2:
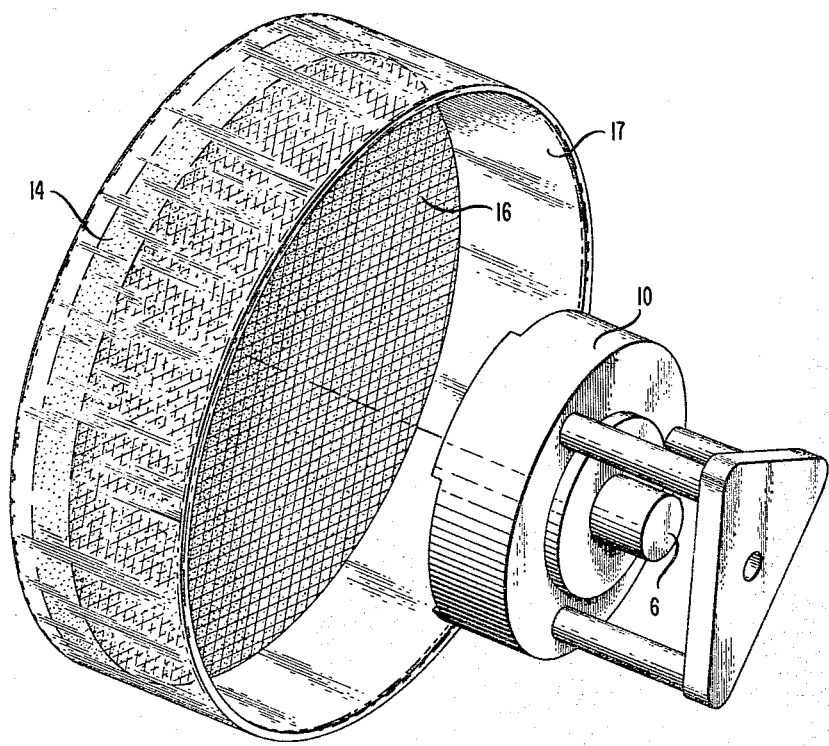
FIG. 2 shows the hard polishing plate necessary for the subject process in conjunction with the semiconductor material holder.

The collar and mounting assembly are then placed on a polishing plate, 14, (FIG. 2), so that the semiconductor surface to be treated is in intimate contact with this plate. To obtain highly polished surfaces, i.e., surfaces flat to less than ±0.2 mils across the entire sample and to prevent rounding of these surfaces, a polishing plate having a mohs hardness greater than 2, preferably equal to or harder than 6.0 on the mohs scale (See Danas and Kinney, supra for the definition of the mohs scale and its relation to other hardness scales) should be utilized. For example, quartz and plate 7 and 6 mohs respectively each yield excellent results. It should be noted that rounding of the polished substrate increases as the hardness of the plate decreases. Soft substrates such as teflon are unacceptable since they produce excessive rounding and a scratched surface.

Additionally, to obtain these flat and highly polished surfaces, the plate must be grooved. The size of the grooves and the number of grooves must be sufficient so that it is possible for a chemical etchant to wet the entire surface of the semiconductor body when deposited in substantial quantity on the plate. Preferably to promote uniformly of the polish, the grooves should be distributed essentially uniformly on the plate. In a preferred embodiment, the grooves are fabricated in a checkerboard pattern (16 in FIG. 2) to insure uniform etching. It has been found that sufficient etchant penetration is achieved when the ratio of groove to adjacent flat area is greater than 1/12 preferably greater than 1/10. The flat areas should be sufficiently wide and sufficiently frequent so that the semiconductor wafer being polished remains parallel to the polishing plate surface during processing. These grooves are also made sufficiently wide and deep to insure unencumbered flow of the etchant. This criteria for typical etchants is satisfied when grooves approximately 30 mils deep, and 30 mils wide are used.

The composition of the chemical etchant is not critical. Any conventional chemical etchant for the semiconductor to be polished is adequate. The slower the etching action the better surface. Therefore, an etchant yielding an appropriate compromise between polish quality and etching time should be chosen. For example, when GaAs is treated, a well-known and advantageous etchant is a 3 to 1 to 1 mixture of concentrated $H_2SO_4$, 30% $H_2O_2$, and distilled, deionized $H_2O$. This etchant results in surface flat to about ±0.2 mil across a 1½ inch substrate and etch rates of 15 mil/hr. During the etching process particles of the semiconductor body are often dislodged, and then function in essence as abrasive particles. During processing these particles (usually having a weight percent of about $10^{-2}$% of the etchant) are inherently removed into the grooves and scratching is avoided. To insure this removal of abrasive particles occurs, the chemical etchant also should be substantially free of abrasive material, i.e., there should be less than $10^{-1}$ weight percent of particulate matter capable of scratching the semiconductor initially in the etchant before the polishing procedure is initiated. The etchant generally is supplied to the material in adequate quantity by enclosing the polishing plate in a container 17. The container is then filled with the etchant until the etchant level is above the surface to be polished. However the level should be limited so excessive splashing is avoided during processing.

Once the body to be treated is placed in the etchant, a pressure typically between 40 g/cm$^2$ and 50 g/cm$^2$ is applied by conventional techniques such as weighting. A translational motion across the plate is imparted. It is advantageous that the magnitude of this translational motion is long enough to insure that the polished semiconductor material crosses the centerpoint of the polishing plate before each direction reversal. If this is not done, there is an additional possibility of imparting undesirable patterns to the substrate. Obviously to produce this crossing the plate should be sufficiently large relative to the semiconductor body and its holder to geometrically allow such translations.

As a further precaution against non-uniformity, it is advantageous to rotate the substrate. The translational and rotational speeds should be slow enough to avoid splashing of the etchant but fast enough to insure uniformity during the period of treatment. Typical speeds for rotation and translation are approximately 15 rpm and 72 transversals per minute respectively. A conventional apparatus for producing the desired translational and rotational motion is described in *Optical Production Technology*, D. F. Horne, Crane Russak Company, New York, 1972 page 141.

The substrate is etched until the desired material is removed and/or the desired polish is obtained. Typical etch rates are between 10 and 15 mils/hr. Generally, the substrate should not be etched to a thickness less than 0.5 mils since its structural integrity at smaller thicknesses is substantially impaired. The following is a typical example of the subject process:

EXAMPLE 1

A 15 mil thick chromium doped wafer of GaAs approximately ½ inches in diameter was cleaned with typical solvents. A several mil thick layer of polypropylene wax was spread on an alumina substrate having a thickness of 20 mils and a 2 inch diameter. (The polypropylene wax, purchased from Eastman Kodak Company, was purified by dissolving 5 wt% of the wax in refluxing xylene. The xylene is cooled and allowed to stand overnight. The liquid is then filtered and 5 volumes of methanol is added to one volume of the filtered solution. The liquid is decanted from the resulting precipitates. The precipitate is dried for 24 hours at ≦10 mm Hg at a temperature between 100 to 120 degrees C.) The ceramic substrate was placed on a hot plate and heated to 150 degrees C. The GaAs wafer was then pressed into the wax on the ceramic substrate, utilizing a 3 lb weight of similar shape and size to the alumina substrate.

The excess wax was removed using Cobehn (a proprietary product of Cohen Inc, Fairfield, N.J. having a main constituent of chloroform.) The thickness of the ceramic plate and the thickness of the GaAs wafer was measured using an electronic micrometer—an instrument utilizing a stylus whose deflection is sensed through a transducer. A teflon mounting block, 6, in FIG. 1, positioned in its collar, 10, was rinsed in distilled water and the ceramic substrate with the GaAs wafer exposed was pressed into the depression in this block. The depression was machined so that it had the same cross-sectional shape as the alumina substrate and had a depth equal to the thickness of the alumina substrate. (Once the etching process begins, the small amount of water trapped behind the alumina plate mixes with the water based etchant and no deleterious effect occurs.)

A glass plate, 14, 8 inches in diameter and ¼ inch thick, having 30 mils wide and 30 mils deep grooves spaced approximately ¼ inch center to center was placed in a glass container, 17, having an inside diameter approximately equivalent to the glass plate. The grooves were cut in a checkerboard pattern. An etchant was introduced in the glass cylinder so that the surface of the etchant solution was approximately ½ inch above the grooved surface of the plate. This etchant was a solution of 3 parts of concentrated $H_2SO_4$, 1 part of 30% $H_2O_2$, and 1 part of distilled, deionized water. The collar, 10, with the mounting substrate, 6, ceramic disc, 3 and GaAs wafer was then placed so that the surface of the GaAs wafer was resting on the plate. The arm, 27, (FIG. 3) from the machine which imparts translational motion to the mounting collar was attached to a hole in the top of the collar, 24. The dish was then rotated at approximately 15 rpm by turntable, 26 and a translational motion of approximately 72 crossings per minute was also imparted.

The etching was stopped every 15 minutes (more often when the desired thickness is approached) and the thickness of the GaAs wafer measured. This process of alternate measurement and treatment was continued until the desired thickness of the GaAs wafer was achieved. Typically, etchant rates of 15 mils an hour were obtained. The surface flatness of the final GaAs wafer was measured in the electronic micrometer by scanning the surface and was approximately flat to ±0.2 mils.

I claim:

1. A method for treating a semiconductor body comprising transversing a plate with said semiconductor body in the presence of a composition which induces the removal of the treated surface of said semiconductor body CHARACTERIZED IN THAT said plate is composed of a material having a hardness greater than 2 on the mohs scale, said plate has grooves in the surface which allow said composition to wet the entire treated surface of said semiconductor body, and said composition comprises a chemical etchant substantially devoid of abrasive material.

2. The method of claim 1 wherein said plate is composed of quartz.

3. The method of claim 1 wherein said chemical etchant comprises a $H_2O_2/H_2SO_4/H_2O$ solution.

4. The method of claim 1 wherein said semiconductor body comprises GaAs.

5. The method of claim 1 wherein the hardness of said plate is greater than 6 on the mohs scale.

6. The method of claim 1 wherein said grooves are arranged in an intersecting pattern.

* * * * *

UNITED STATES PATENT AND TRADEMARK OFFICE
CERTIFICATE OF CORRECTION

PATENT NO. : 4,244,775
DATED : January 13, 1981
INVENTOR(S) : Lucian A. D'Asaro

It is certified that error appears in the above-identified patent and that said Letters Patent are hereby corrected as shown below:

Column 2, line 17, "A" should read --$\overset{\circ}{A}$--. Column 4, line 47, "1/2" should read --1-1/2--.

*Signed and Sealed this*

*Nineteenth* Day of *May 1981*

[SEAL]

*Attest:*

RENE D. TEGTMEYER

*Attesting Officer*     *Acting Commissioner of Patents and Trademarks*